US012796403B2

(12) United States Patent
Lee et al.

(10) Patent No.: US 12,796,403 B2
(45) Date of Patent: Nov. 10, 2026

(54) ELECTRICAL TESTING OF SEMICONDUCTOR PACKAGES THAT INCLUDE BUILD-UP STRUCTURE AND CORE STRUCTURE TO BE BONDED

(71) Applicant: Taiwan Semiconductor Manufacturing Company, Ltd., Hsinchu (TW)

(72) Inventors: Ya Huei Lee, Miaoli County (TW); Ping Tai Chen, Taipei City (TW); Kuo-Ching Hsu, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 440 days.

(21) Appl. No.: 18/456,291

(22) Filed: Aug. 25, 2023

(65) Prior Publication Data

US 2024/0387296 A1 Nov. 21, 2024

Related U.S. Application Data

(60) Provisional application No. 63/508,096, filed on Jun. 14, 2023, provisional application No. 63/502,513, filed on May 16, 2023.

(51) Int. Cl.

| | |
|---|---|
| ***H10P 74/20*** | (2026.01) |
| ***H10W 44/00*** | (2026.01) |
| ***H10W 70/05*** | (2026.01) |
| ***H10W 70/65*** | (2026.01) |
| ***H10W 70/685*** | (2026.01) |
| ***H10W 70/69*** | (2026.01) |

(52) U.S. Cl.

CPC ......... *H10P 74/207* (2026.01); *H10W 44/601* (2026.01); *H10W 70/05* (2026.01); *H10W 70/093* (2026.01); *H10W 70/095* (2026.01); *H10W 70/65* (2026.01); *H10W 70/685* (2026.01); *H10W 70/69* (2026.01)

(58) Field of Classification Search

CPC . H10P 74/207; H10W 70/685; H10W 70/093; H10W 70/095; H10W 70/65; H10W 44/601; H10W 70/69; H10W 70/05

See application file for complete search history.

(56) References Cited

U.S. PATENT DOCUMENTS

| | | | | |
|---|---|---|---|---|
| 10,923,421 | B2 | 2/2021 | Chen | |
| 11,282,761 | B2 | 3/2022 | Wu | |
| 2015/0235915 | A1 | 8/2015 | Liang | |
| 2020/0144234 | A1 | 5/2020 | Jeon | |
| 2021/0343547 | A1* | 11/2021 | Chang | H10P 54/00 |
| 2022/0039261 | A1 | 2/2022 | Hwang | |
| 2022/0285233 | A1* | 9/2022 | Li | H10P 74/277 |
| 2023/0317529 | A1* | 10/2023 | Wang | H10P 74/207 |

* cited by examiner

*Primary Examiner* — Michael Jung

(74) *Attorney, Agent, or Firm* — HAYNES AND BOONE, LLP

(57) ABSTRACT

Methods of conducting electrical tests on semiconductor packages are provided. A method according to the present disclosure includes forming a build-up structure that includes a plurality of metal layers embedded a plurality of dielectric layers, forming a core structure that embeds a passive device, performing a first electrical test on the build-up structure, performing a second electrical test on the core structure, and after performing the first electrical test and the second electrical test, bonding the build-up structure to the core structure.

20 Claims, 13 Drawing Sheets

ELECTRICAL TESTING OF SEMICONDUCTOR PACKAGES THAT INCLUDE BUILD-UP STRUCTURE AND CORE STRUCTURE TO BE BONDED

PRIORITY DATA

This application claims priority to U.S. Provisional Patent Application No. 63/502,513, filed on May 16, 2023, and U.S. Provisional Patent Application No. 63/508,096, filed on Jun. 14, 2023, each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

To ensure quality and lifetime, IC devices may be subject to high voltage stress testing. While such high voltage stress testing is useful in identify device defects, the high testing voltage may damage sensitive embedded passive devices.

BRIEF DESCRIPTION OF THE DRAWINGS

The present disclosure is best understood from the following detailed description when read with the accompanying FIGURES. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
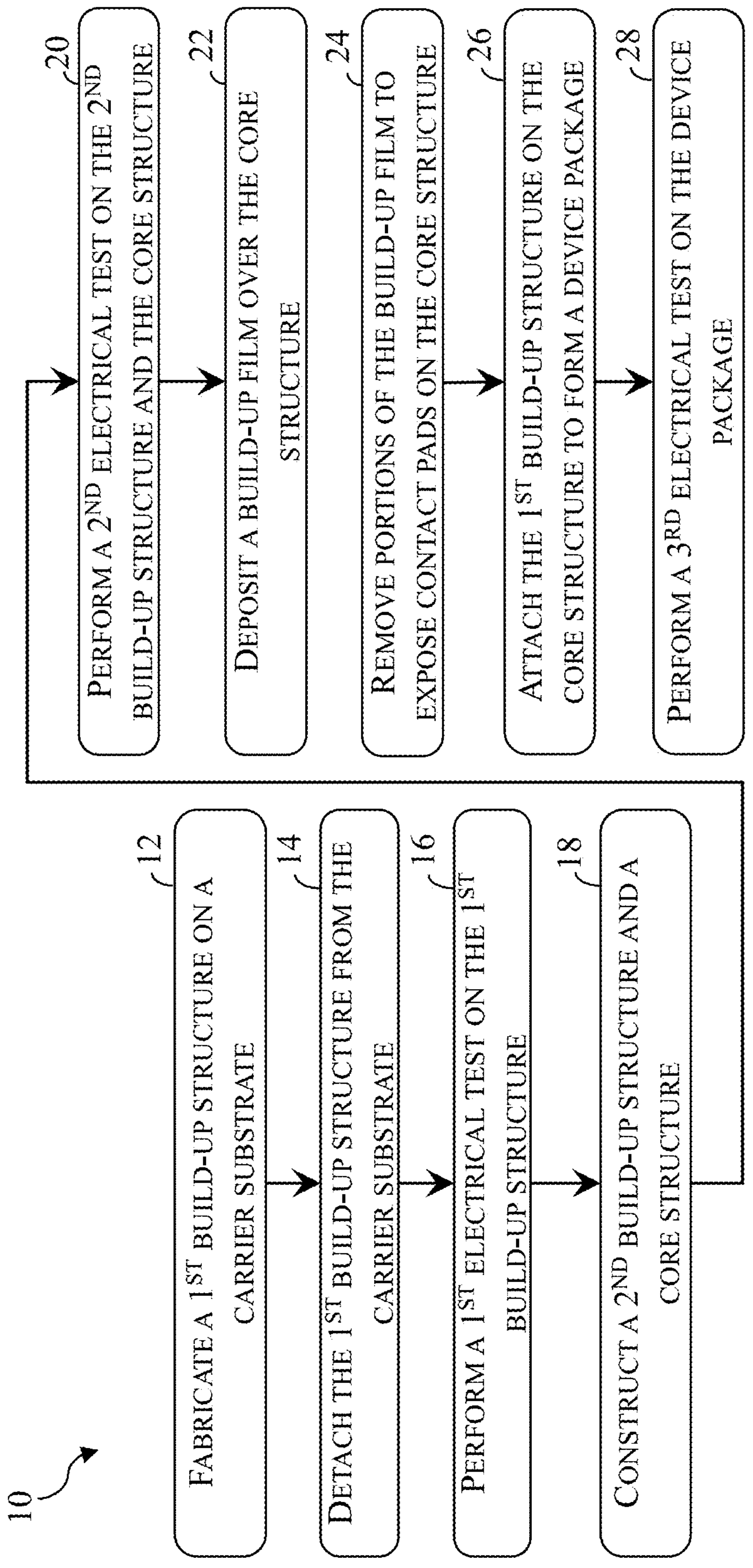
FIG. 1 illustrates a flowchart of a method for forming and testing a device package, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the FIGURES. The spatially relative terms are intended to encompass different orientations of the device in use or operation in addition to the orientation depicted in the FIGURES. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

As functional densities of IC devices increase, the interconnect paths that connect various active and passive devices in a device package are becoming more and more intricate. In recent years, the transition from fossil fuels to electric energy has taken the world by storm. The efficiency and reliability of high-performance power semiconductor applications have become an arena of competition in the industry. To broaden the spectrum of application, stress tests are developed to detect possible failures. Humidity and temperature are stressors that can trigger failure mechanisms and allow circuit designer to improve the reliability and performance. A biased highly accelerated stress test (b-HAST) or a high-voltage temperature humidity bias test (HV-THB) is developed to accelerate tests of efficiency, reliability, and performance of device packages and power modules. As an accelerated test, a biased highly accelerated stress test (b-HAST) or a high-voltage temperature humidity bias test (HV-THB) use a high voltage (often greater than 100V). Sometimes the testing voltage may be much greater than the operating voltage of an embedded device. More often than not, the testing voltage may cause dielectric breakdown of some embedded devices, resulting in unnecessary waste of components.

The present disclosure provides a method to conduct stress testing to a core structure that includes an embedded passive device and a build-up structure separately to ensure integrity and performance of interconnect paths on the core structure and the build-up structure. The separate stress tests are conducted such that high voltage of the stress testing is applied to interconnect paths but is not applied to the embedded passive device. After the stress testing, the build-up structure is bonded or welded to the core structure by use of metal paste and glue paste. One or more low-voltage electrical tests may be performed to the final structure to ensure proper electrical connection.

The various aspects of the present disclosure will now be described in more detail with reference to the FIGURES. In that regard, FIG. 1 is a flowchart illustrating a method 10 for forming and testing a device package according to various aspects of the present disclosure. Method 10 is merely an example and is not intended to limit the present disclosure to what is explicitly illustrated in method 10. Additional steps may be provided before, during and after method 10, and some steps described can be replaced, eliminated, or moved around for additional embodiments of the method. Not all steps are described herein in detail for reasons of simplicity. Method 10 is described below in conjunction with FIGS. 2-11, which are fragmentary cross-sectional views of at least one build-up structure, at least one core structure, or a combination thereof at different stages of fabrication according to embodiments of method 10. Additionally, throughout the present application and across different embodiments, like reference numerals denote like features with similar structures and compositions, unless otherwise excepted. Source/drain region(s) may refer to a source or a drain, individually or collectively, dependent upon the context.

Figure 2:
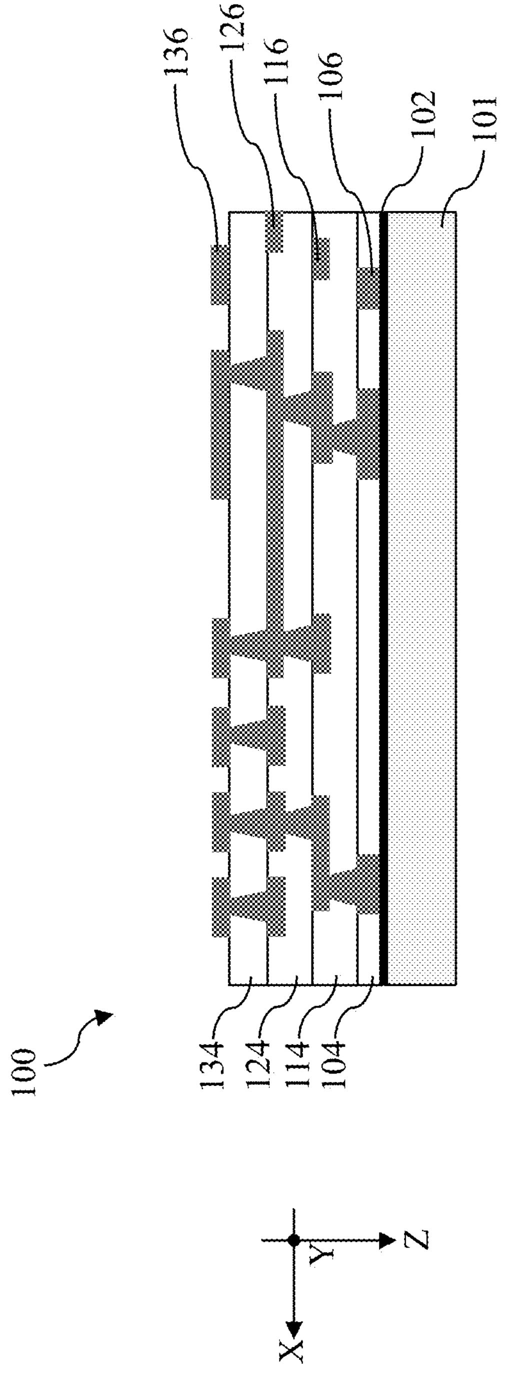
FIGS. 2-13 include fragmentary cross-sectional views of build-up structures and a core structure undergoing various stages of operations during the performance of the method in FIG. 1, according to various aspects of the present disclosure.

Referring to FIGS. 1 and 2, method 10 includes a block 12 where a first build-up structure 100 is fabricated on a carrier substrate 101. As shown in FIG. 2, because the first build-up structure 100 is to be subject to an electrical test after it is fabricated, it is fabricated on a carrier substrate 101. In some embodiments, the carrier substrate 101 may be a glass substrate. To enable release of the first build-up structure 100 from the carrier substrate 101, a release film 102 is deposited on the carrier substrate 101. The release film 102 may be a thermal release film or a UV release film. The release film 102 may include a thermal cleavable functional group or a UV cleavable functional group. In some instances, the release film 102 may include polyethylene terephthalate (PET), poly(p-phenylene ether) (PPE) or Poly(p-phenylene oxide) (PPO). The release film 102 may be slit coated on a top surface of the carrier substrate 101. The first build-up structure 100 is formed on the release film 102 such that it can be subsequently released from the carrier substrate 101.

As illustrated in FIG. 2, the first build-up structure 100 includes a plurality of build-up films and a plurality of metal layers. In some embodiments, the plurality of build-up films include Ajinomoto Build-up Films (ABF). In an example process, a first seed layer is deposited on the release film 102 by physical vapor deposition (PVD). The first seed layer may include titanium (Ti), copper (Cu), or alloy thereof. While not explicitly shown in FIGURES, a photoresist layer is deposited over the first seed layer and is patterned using photolithography process to form openings where portions of the first seed layer are exposed. Copper (Cu) is then deposited on the exposed portions of the first seed layer by electroplating or electroless plating. At this point, the first metal layer 106 is formed over the release film 102. After the photoresist is removed by ashing, a first build-up film 104 is deposited over the first metal layer 106 and is cured. The cured first build-up film 104 is then patterned using laser drilling to expose the first metal layer 106. After the laser drilling on the first build-up film 104, a second seed layer is deposited over the first build-up film 104 and the first metal layer 106. A photoresist layer is deposited over the second seed layer and is patterned using photolithography process to form openings where portions of the second seed layer are exposed. Copper (Cu) is then deposited on the exposed portions of the second seed layer by electroplating or electroless plating. At this point, the second metal layer 116 is formed. After the photoresist is removed by ashing, a second build-up film 114 is deposited over the second metal layer 116 and the first build-up film 104 and is cured. The cured second build-up film 114 is then patterned using laser drilling to expose the second metal layer 116. A similar process cycle that includes deposition of a seed layer, formation of a patterned photoresist layer, electroplating of a metal layer, removal of the patterned photoresist layer, deposition of another build-up film, and laser drill of the build-up film is then repeated for a suitable time to form the first build-up structure 100. In some embodiments represented in FIG. 2, the process cycle is repeated to also form a third metal layer 126 and a fourth metal layer 136 and associated third build-up film 124 and fourth build-up film 134. It is noted that while four build-up films and four metal layers are illustrated in FIG. 2, the present disclosure is not so limited. The first build-up structure 100 may include more or less build-up films as well as more or less metal layers.

Figure 3:
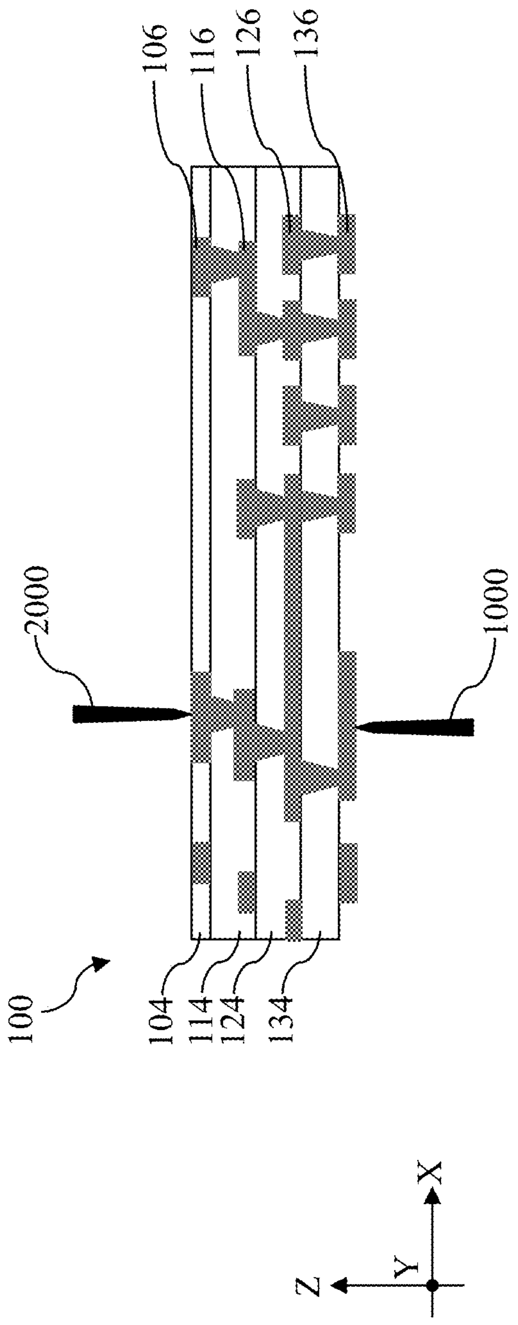

Referring to FIGS. 1 and 3, method 10 includes a block 14 where the first build-up structure 100 is detached from the carrier substrate 101. After the first build-up structure 100 is fabricated at block 12, a heat source or a UV source may be applied to the release film 102 to release the first build-up structure 100 from the carrier substrate 101.

Referring to FIGS. 1 and 3, method 10 includes a block 16 where a first electrical test is performed on the first build-up structure 100. The first electrical test may be a biased highly accelerated stress test (b-HAST) or a high-voltage temperature humidity bias test (HV-THB). The first electrical test may be performed by using at least one first probe 1000 and at least one second probe 2000. The at least one first probe 1000 or the at least one second probe 2000 may be one of a large number of probes of a probe card. During the first electrical test, a voltage between about 100 V and about 200 V may be applied across the at least one first probe 1000 and the at least one second probe 2000. The first electrical test may be carried out in a test chamber with a controlled humidity and a controlled temperature. In some instances, a relative humidity in the test chamber may be between 50% and about 100%, including between about 80% and about 90%. A temperature of the test chamber may be set at between about 70° C. and about 100° C., including between about 80° C. and about 90° C. It is noted that because the first build-up structure 100 is not electrically coupled to any passive device, subjecting it to the first electrical test is not associated with any risk of damaging any passive device.

Figure 4:
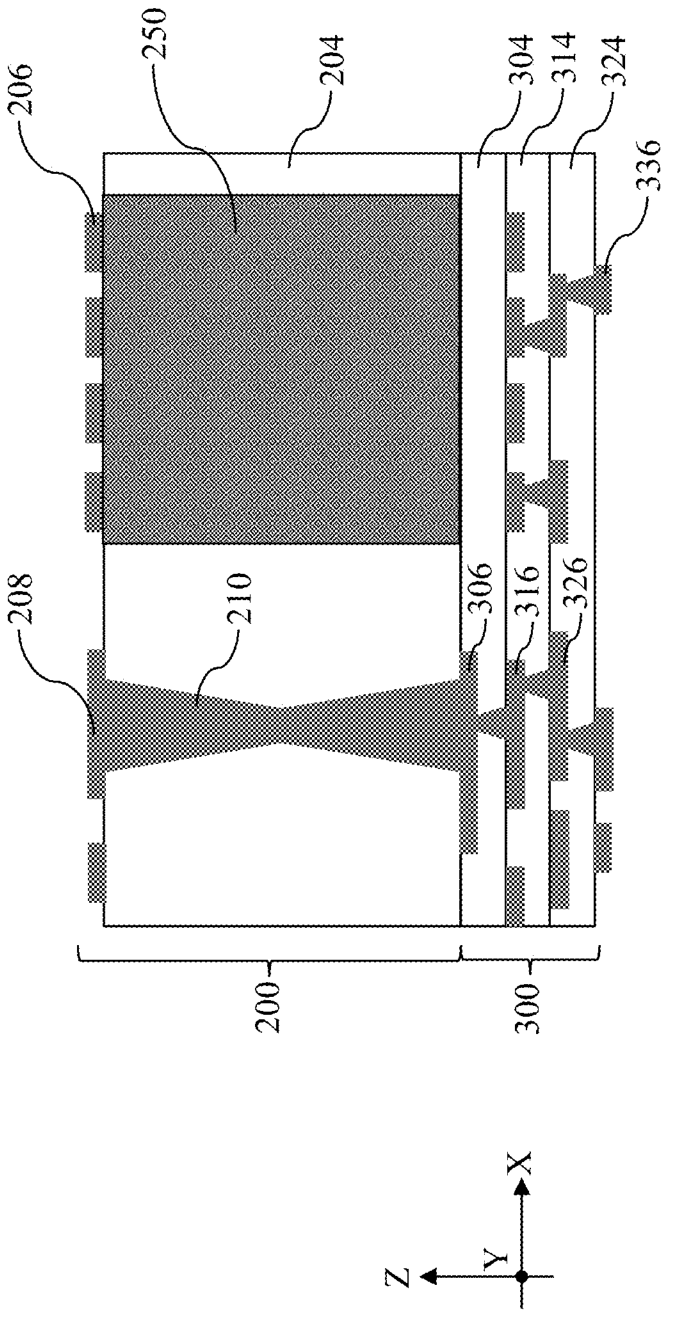

Referring to FIGS. 1 and 4, method 10 includes a block 18 where a core structure 200 and a second build-up structure 300 are constructed. In some embodiments, the core structure 200 includes a core dielectric layer 204, a passive device 250 embedded in the core dielectric layer 204, first contact pads 206 and second contact pads 208 over a front surface of the core structure 200, and at least one through via 210 that extends through the core dielectric layer 204.

In some embodiments, the core dielectric layer 204 may include polyimide (PI), epoxy resin, silica filler, or glass fiber. In one embodiment, the core dielectric layer 204 includes epoxy resin. The core dielectric layer 204 may be formed using a lamination process, a coating process, or the like. In the depicted embodiments, the core dielectric layer 204 is formed by laminating more than one core dielectric sublayers together. To embed the passive device 250 in the core dielectric layer 204, a device recess may be formed in the core dielectric layer 204 by drilling and then fabrication processes for the passive device 250 are performed to form the passive device 250 in the device recess. In some alternative embodiments, the passive device 250 is a discrete device and is placed in the device recess and the gap between the discrete device and the device recess is filled with a gap filler, such as an encapsulant. In some embodiments, the passive device 250 may be one that is prone or susceptible to damages when a high voltage. In some instances, the passive device 250 may be a multilayer ceramic capacitor (MLCC), a metal-insulator-metal (MIM) capacitor, a deep trench capacitor (DTC), or a different type of capacitor. An MLCC includes a plurality of electrode plates interleaved by a plurality of ceramic layers. The plurality of electrode plates in an MLCC are separated into two groups connected to two connecting terminal on two ends of the MLCC. An MIM capacitor includes a plurality of conductor plates interleaved by a plurality of insulation layers. A plurality of via penetrate through the plurality of conductor plates to selectively couple to different ones of the plurality of conductor plates. A DTC includes a plurality of metal layers conformally deposited over trenches formed in a dielectric layer. The plurality of metal layers of a DTC are insulated from one another by a plurality of dielectric layers. The passive device 250 may have an operating voltage smaller than 10V, which may be more than 10 times lower than the testing voltage of the first electrical test or the subsequent second electrical test. The passive device 250 is not designed to withstand a testing voltage used in a biased highly accelerated stress test (b-HAST) or a high-voltage temperature humidity bias test (HV-THB) without breakdown.

The core structure 200 also includes a through via 210. In some embodiments, the through via 210 includes a conductive material deposited in a through hole that completely penetrates a thickness of the core dielectric layer 204. The through hole may be formed using laser drilling or etching. In some embodiments represented in FIG. 4, the through hole may include a first portion etched from a first surface of the core dielectric layer 204 and a second portion etch from a second surface of the core dielectric layer 204. The first portion and the second portion may each taper toward a center level of the core dielectric layer 204. That is, the first portion and the second portion taper toward diagonal directions. The first portion and the second portion are aligned or joined to form a through via. In some embodiments represented in FIG. 4, the through hole may be substantially filled by the conductive material to form a solid through via 210. In some alternative embodiments, the conductive material is deposited along sidewalls of the through hole to form a plated through hole. The conductive material may be deposited using plating. In an example process, a seed layer, such as a copper-containing layer or a titanium-containing layer, is deposited over the via hole. Then copper (Cu) is plated over the seed layer using electroplating or a electroless plating. When the through via 210 is a plated through hole, the space left behind by the plated metal layer may be filled with a dielectric material. The through via 210 provides electrical paths between the electrical circuits located on two opposite sides of the core dielectric layer 204. The core structure 200 also includes first contact pads 206 and second contact pads 208 disposed on a top surface of the core dielectric layer 204. The first contact pads 206 are those that are electrically coupled to the passive device 250 while the second contact pads 208 are those that are not electrically coupled to the passive device 250. The first contact pads 206 and the second contact pads 208 may include copper (Cu).

While FIG. 4 illustrates the second build-up structure 300 attached to the core structure 200, the second build-up structure 300 may be omitted in some embodiments. Like the first build-up structure 100, the second build-up structure 300 includes a plurality of build-up films 304, 314, and 324 and a plurality of metal layers 306, 316, 326, and 336. Each of the plurality of build-up films may include Ajinomoto Build-up Films (ABF). Each of the plurality of metal layers may include a seed layer and a plated layer. The seed layer may include titanium (Ti), copper (Cu), or an alloy thereof. The plated layer may include copper (Cu). In an example process, a first seed layer is deposited on a back surface of the core structure 200 by physical vapor deposition (PVD). The first seed layer may include titanium (Ti), copper (Cu), or alloy thereof. While not explicitly shown in figures, a photoresist layer is deposited over the first seed layer and is patterned using photolithography process to form openings where portions of the first seed layer are exposed. Copper (Cu) is then deposited on the exposed portions of the first seed layer by electroplating or electroless plating. At this point, a metal layer 306 is formed over the back surface of the core structure 200. After the photoresist is removed by ashing, a build-up film 304 is deposited over the metal layer 306 and is cured. The cured build-up film 304 is then patterned using laser drilling to expose the metal layer 306. After the laser drilling on the build-up film 304, a second seed layer is deposited over the build-up film 304 and the metal layer 306. A photoresist layer is deposited over the second seed layer and is patterned using photolithography process to form openings where portions of the second seed layer are exposed. Copper (Cu) is then deposited on the exposed portions of the second seed layer by electroplating or electroless plating. At this point, the metal layer 316 is formed. After the photoresist is removed by ashing, a build-up film 314 is deposited over the metal layer 316 and the build-up film 304 and is cured. The cured build-up film 314 is then patterned using laser drilling to expose the metal layer 316. A similar process cycle that includes deposition of a seed layer, formation of a patterned photoresist layer, electroplating of a metal layer, removal of the patterned photoresist layer, deposition of another build-up film, and laser drill of the build-up film is then repeated for a suitable time to form the second build-up structure 300 on the back surface of the core structure 200. In some embodiments represented in FIG. 4, the process cycle is repeated to also form a metal layer 326 and a metal layer 336 and associated build-up film 324. It is noted that while three build-up films and four metal layers are illustrated in FIG. 4, the present disclosure is not so limited. The second build-up structure 300 may include more or less build-up films as well as more or less metal layers.

Because the second build-up structure 300 is not separately electrically tested, it is not fabricated on a carrier substrate and then released from it thereafter. The second build-up structure 300 is formed on and disposed over a back surface of the core structure 200. In the depicted embodiments where the second build-up structure 300 is already bonded to a second surface of the core structure 200, the second contact pads 208 may be in electrical communication with the metal layers in the second build-up structure 300. In a subsequent electrical test, probing the first contact pads 206 and contact pads on the second build-up structure 300 may cause the testing voltage across the passive device 250, resulting in dielectric break down. However, probing the second contact pads 208 and the contact pads on the second build-up structure 300 would not cause the testing voltage across the passive device 250. In some alternative embodiments, the metal features/metal layers in the second build-up structure 300 are not electrically coupled to (or are insulated from) the passive device 250 and may be subject to high testing voltage without damaging the passive device 250.

Figure 5:
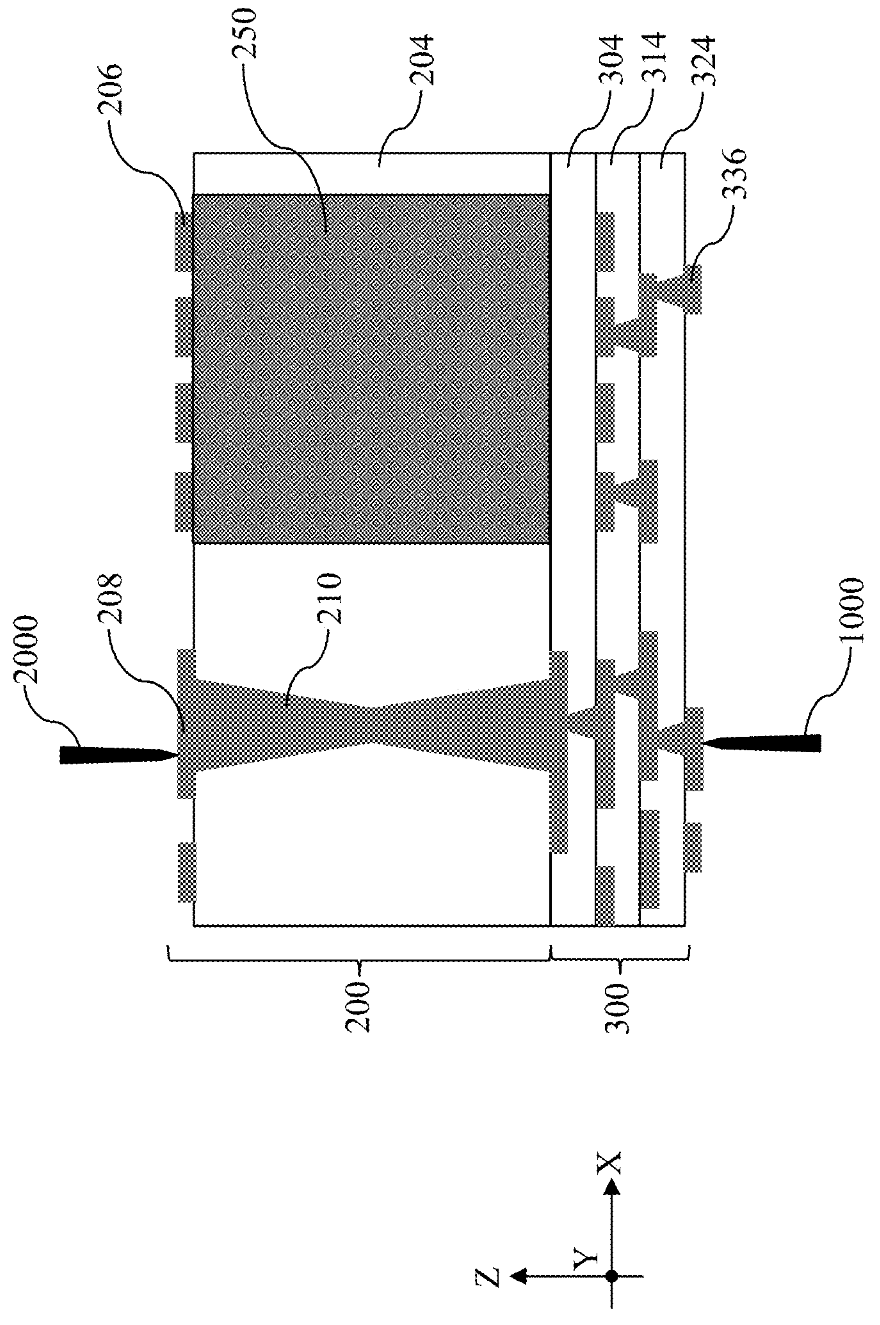

Referring to FIGS. 1 and 5, method 10 includes a block 20 where a second electrical test is performed on the core structure 200 and the second build-up structure 300. Like the first electrical test at block 16, the second electrical test may also be a biased highly accelerated stress test (b-HAST) or a high-voltage temperature humidity bias test (HV-THB). The second electrical test may be performed by using the at least one first probe 1000 and the at least one second probe 2000. During the second electrical test, a voltage between about 100 V and about 200 V may be applied across the at least one first probe 1000 and the at least one second probe 2000. The second electrical test may be carried out in a test chamber with a controlled humidity and a controlled temperature. In some instances, a relative humidity in the test chamber may be between 50% and about 100%, including between about 80% and about 90%. A temperature of the test chamber may be set at between about 70° C. and about 100° C., including between about 80° C. and about 90° C. It is noted that while the second electrical test is performed to the core structure 200 and the second build-up structure 300 bonded thereto, no test voltage is applied across the passive device 250. For example, none of the first probe 1000 and the second probe 2000 contacts the first contact pads 206 that are electrically coupled to the passive device 250. As such, the second electrical test is performed in a way that does not accompany risk of damages to the passive device 250.

Figure 6:
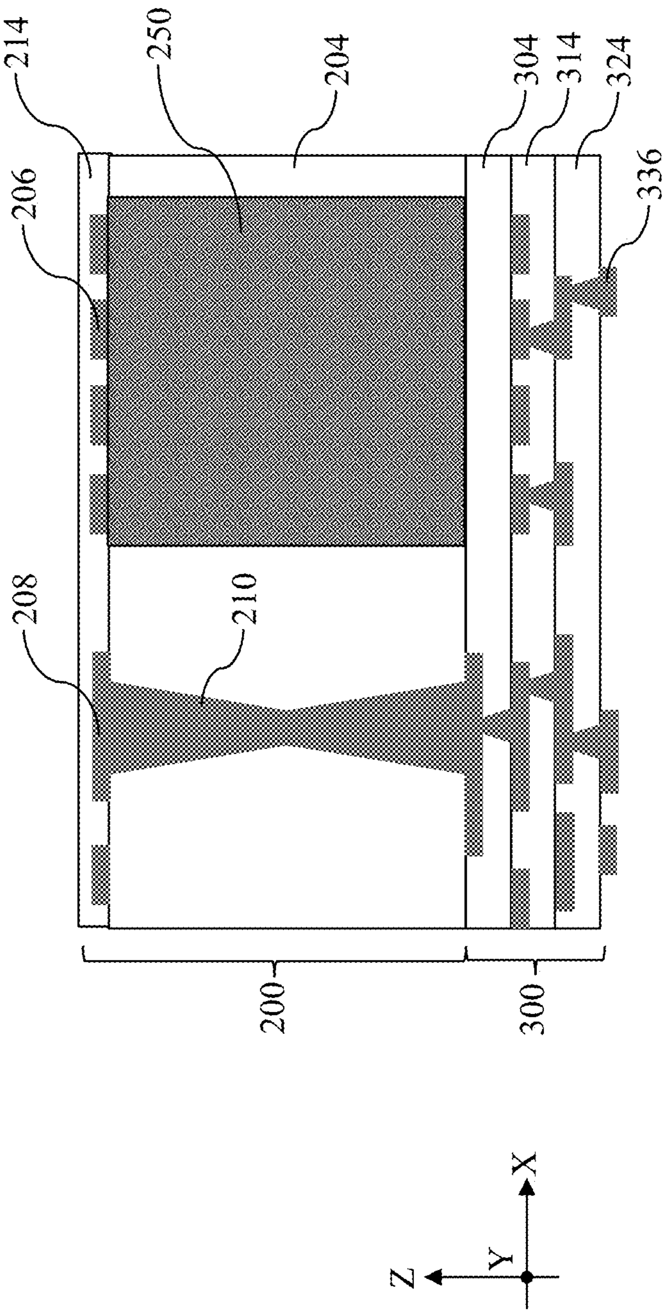

Referring to FIGS. 1 and 6, method 10 includes a block 22 where a build-up film 214 is deposited over the core structure 200. At block 22, a top surface of the core structure 200 is cleaned in preparation of the lamination of the build-up film 214. After the cleaning, the build-up film 214 is laminated on the top surface of the core structure 200. In some embodiments, the build-up film 214 may be an Ajinomoto Build-up Film (ABF). After the lamination of the build-up film 214, the build-up film 214 is cured by annealing at a temperature between about 150° C. and about 200° C.

Figure 7:
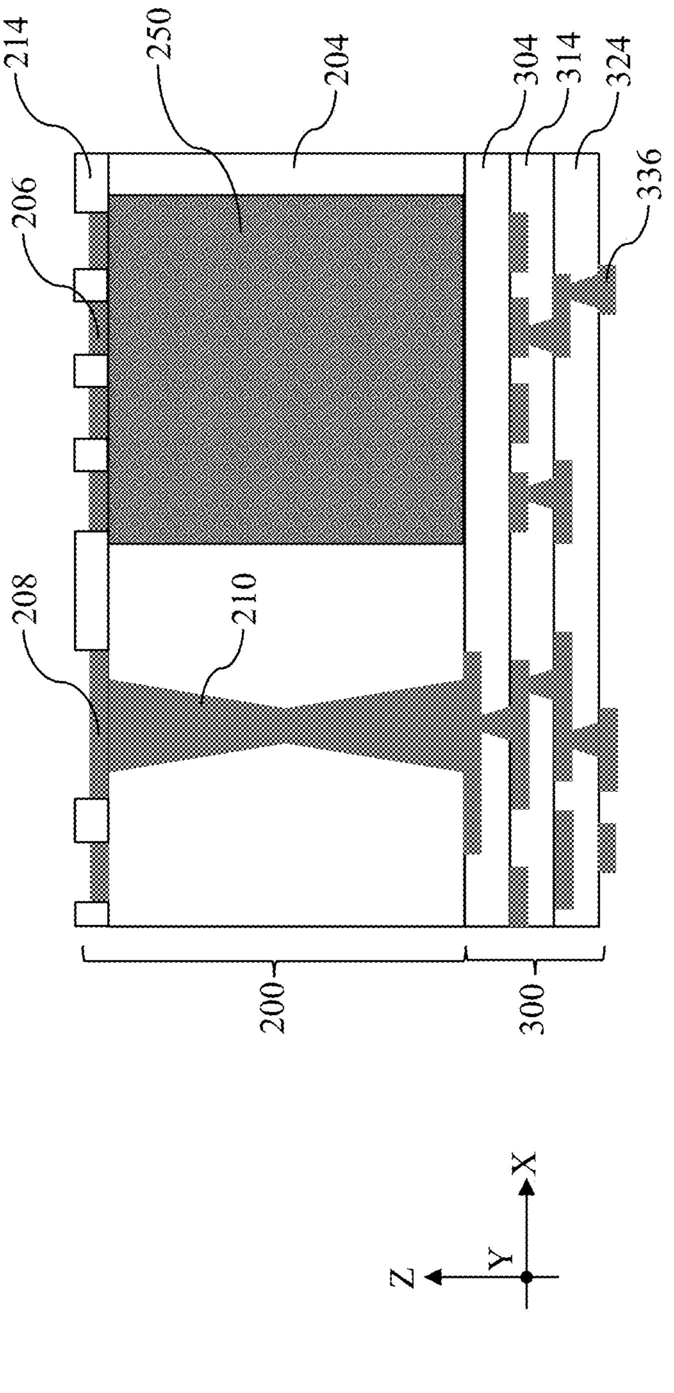

Referring to FIGS. 1 and 7, method 10 includes a block 24 where portions of the build-up film 214 are removed to expose the first contact pads 206 and the second contact pads 208 on the core structure 200. At block 24, laser drilling may be used to remove portions of the build-up film 214 to expose the first contact pads 206 and the second contact pads 208. It is noted that after the laser drilling, a top surface of the build-up film 214 is higher than top surfaces of the first contact pads 206 and the second contact pads 208.

Figure 8:
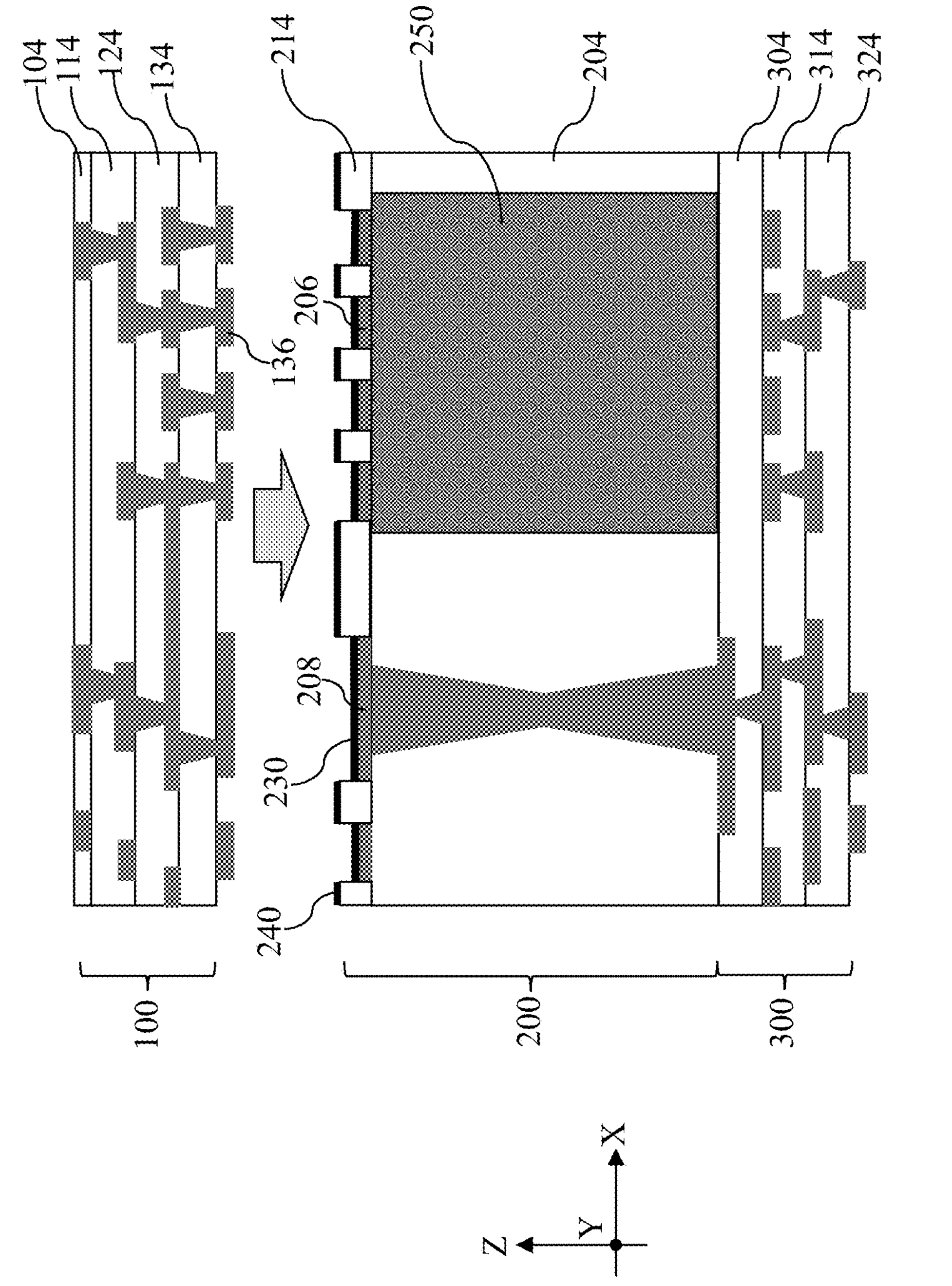
Figure 9:
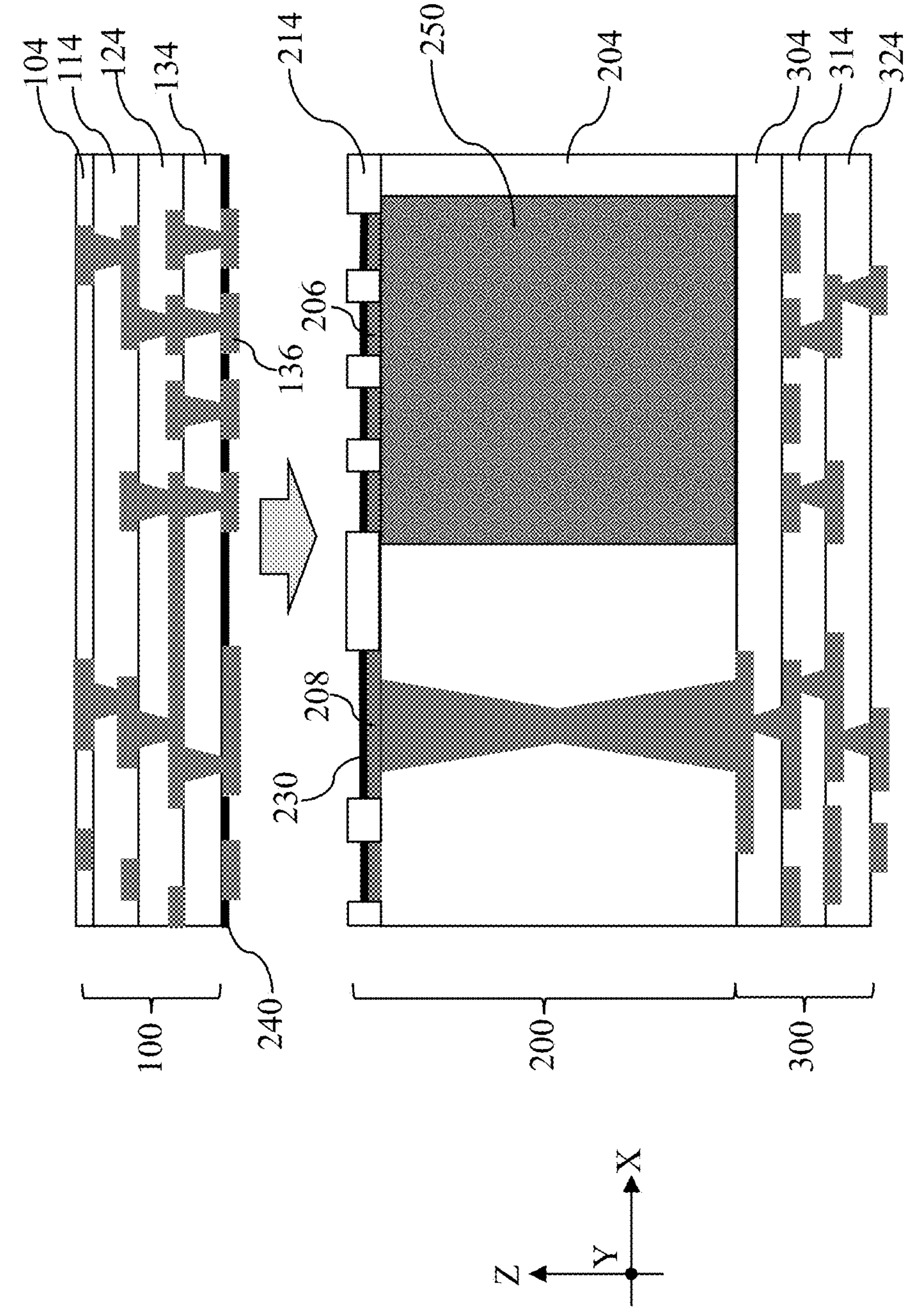
Figure 10:
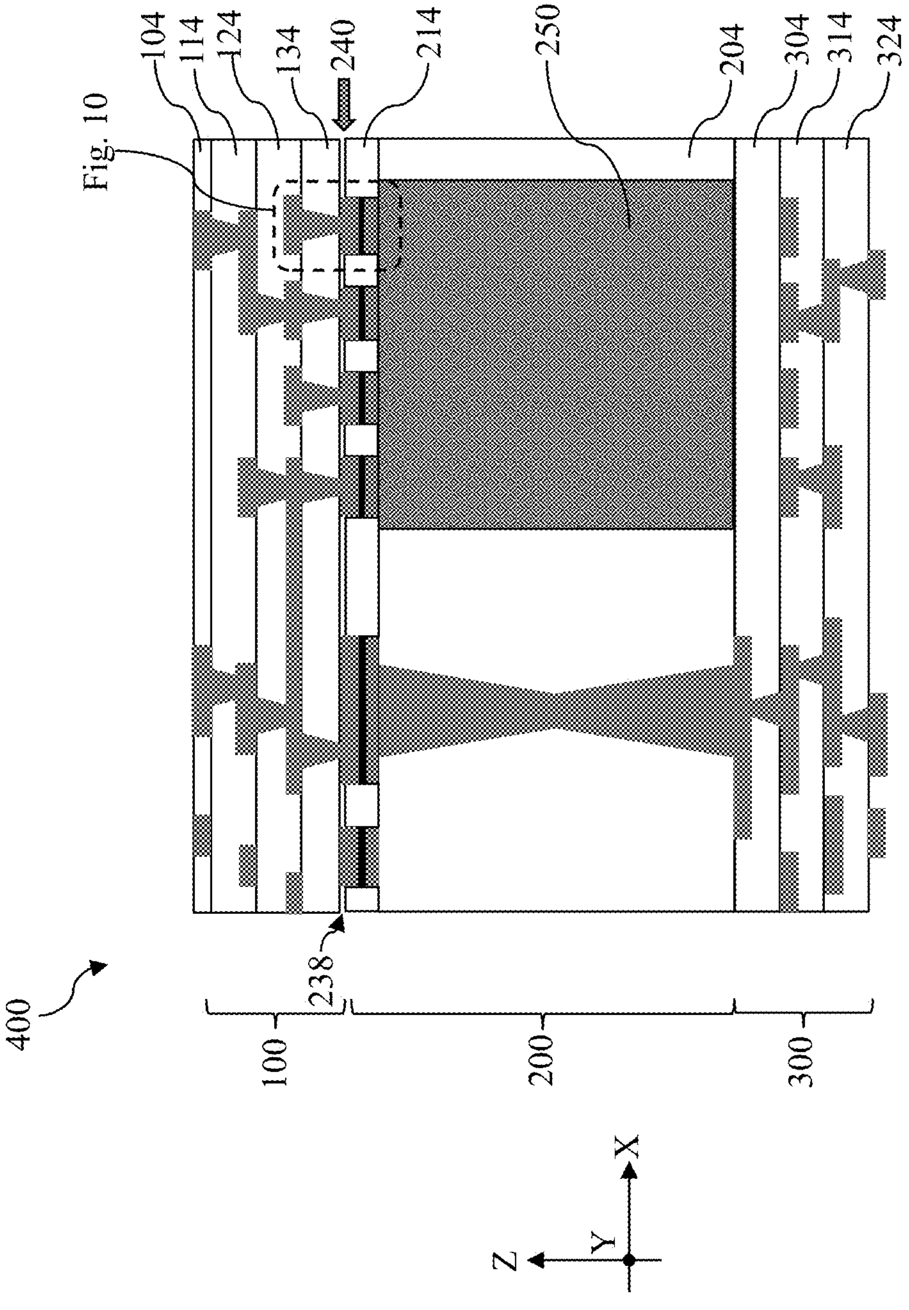

Referring to FIGS. 1 and 8-11, method 10 includes a block 26 where the first build-up structure 100 is attached to the core structure 200 to form a device package 400. The present disclosure provides three example ways to attach the first build-up structure 100 to the core structure 200. All three example ways involve use of metal paste 230 and glue paste 240. FIG. 8 illustrates a first example way where metal paste 230 is deposited on the first contact pads 206 and the second contact pads 208 by stencil printing and glue paste 240 is deposited on the patterned build-up film 214 by injection printing. After the deposition of the metal paste 230 and the glue paste 240 on the core structure 200, the first build-up structure 100 and the core structure 200 are aligned and welded together. FIG. 9 illustrates a second example way where metal paste 230 is deposited on the first contact pads 206 and the second contact pads 208 by stencil printing and glue paste 240 is deposited on the fourth build-up film 134 on the first build-up structure 100 by injection printing. After the deposition of the metal paste 230 on the core structure 200 and the glue paste 240 on the first build-up structure 100, the first build-up structure 100 and the core structure 200 are aligned and welded together. FIG. 10 illustrates a third example way where metal paste 230 is deposited on the first contact pads 206 and the second contact pads 208 by stencil printing. After the deposition of the metal paste 230 on the core structure 200, the first build-up structure 100 and the core structure 200 are aligned and welded together. Due to lack of glue paste 240, a gap 238 exists between the build-up film 214 and the fourth build-up film 134. The glue paste 240 is then allowed to fill in the gap by capillary action. All three example ways may lead to the device package 400 shown in FIG. 11.

The metal paste 230 include a low-melting-point metal that has a melting point equal to or smaller than 260° C. This is critical because the build-up films in the first build-up structure 100 and the core structure 200 may start to deteriorate or deform if the temperature during the welding or bonding process is greater than 260° C. In some embodiments, the metal paste 230 may include tin (Sn) or an alloy of tin, such as Sn—Ag (tin/silver), Sn—Pb (tin/lead), Sn—Cu (tin/copper), or Sn—Ag—Cu (tin/silver/copper). In some instances, the metal paste 230 may also be referred to as a solder paste 230. To deposit the metal paste 230, it may be stencil printed on the first contact pads 206 and the second contact pads 208. The glue paste 240 may include adhesive, such as an epoxy adhesive. When the core structure 200 and the first build-up structure 100 are aligned and pressed together, a reflow process may be performed to melt the metal paste 230 to weld the first contact pads 206 and the second contact pads 208 on the core structure 200 to the fourth metal layer 136 in the first build-up structure 100. In some instances, the reflow process includes a temperature between about 200° C. and about 260° C. When the glue paste 240 is present when the reflow process is performed, the reflow process may also activate and cure the glue paste 240. In the third embodiment where the glue paste 240 is introduced to the gap 238 after the reflow process welds the core structure 200 and the first build-up structure 100, the glue paste 240 in the gap 238 may be subject to a separate thermal curing process to bond the fourth build-up film 134 to the build-up film 214.

Figure 11:
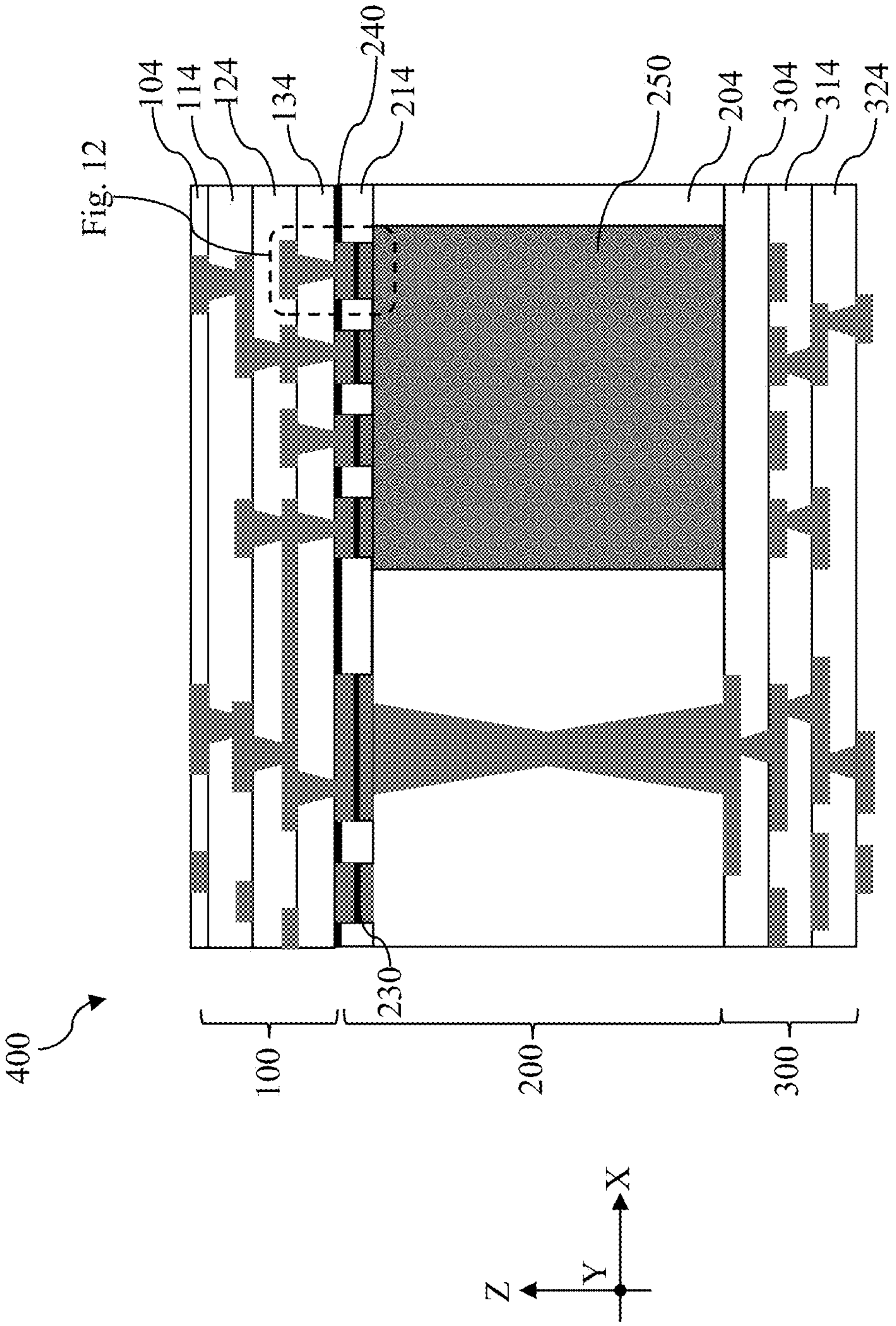
Figure 12:
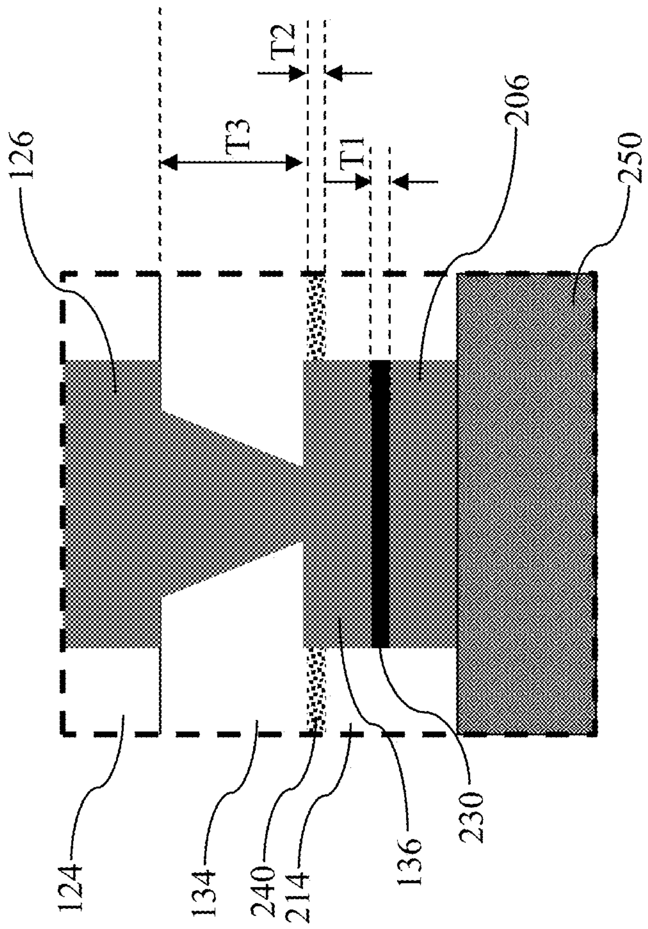

An interface between a metal feature of the fourth metal layer 136 and a first contact pad 206 in the device package 400 in FIG. 11 is enlarged and shown in FIG. 12. After the reflow/welding process, the metal layer 230 (the same reference numeral is used for consistency and simplicity) formed from the metal paste 230 may have a first thickness T1 between about 5 μm and about 30 μm. The cured glue paste 240 may have a second thickness T2 between about 3 μm and about 10 μm. In some instances, the first thickness T1 is greater than the second thickness T2. Each of the fourth build-up film 134 and the build-up film 214 may have a third thickness T3 between about 10 μm and about 20 μm. In some implementations, each of the metal feature of the fourth metal layer 136 and a first contact pad 206 shown in FIG. 12 has a thickness between about 5 μm and about 10 μm. The metal feature of the fourth metal layer 136 and a first contact pad 206 shown in FIG. 12, each accounting for about half of the total thickness, may have a combined total thickness between about 10 μm and about 20 μm. Different from existing structures, the metal feature of the fourth metal layer 136 and a first contact pad 206 vertically sandwiches the metal layer 230, which is made of a metal having a melting temperature lower than that of the fourth metal layer 136 or the first contact pad 206. In one embodiment, the fourth metal layer 136 and the first contact pad 206 include copper (Cu) and the metal layer 230 includes tin (Sn) or an alloy of tin.

Adoption and implementation of method 10 may give the device package 400 unique distinct structural features. For example, the metal layer 230, which includes tin (Sn) or an alloy of tin (Sn), is present between the metal feature of the fourth metal layer 136 and a first contact pad 206, which include copper (Cu). As shown in FIGS. 4 and 11, when the second build-up structure 300 is fabricated directly on the back surface of the core structure 200, no tin-containing metal layer is needed or present at the metal-metal interface. For another example, the glue paste (or a glue layer) is present between the build-up film 214 and the fourth build-up film 134. As shown in FIGS. 4 and 11, when the second build-up structure 300 is fabricated directly on the back surface of the core structure 200, no glue paste is needed and only a single build-up film is needed at the interface. For yet another example, due to the presence of the metal layer 230, the glue paste, and use of two build-up film, the metal layer (including the fourth metal layer 136, a first contact pad 206, and the metal layer 230) is thicker than the metal layer 306 in the second build-up structure 300.

Figure 13:
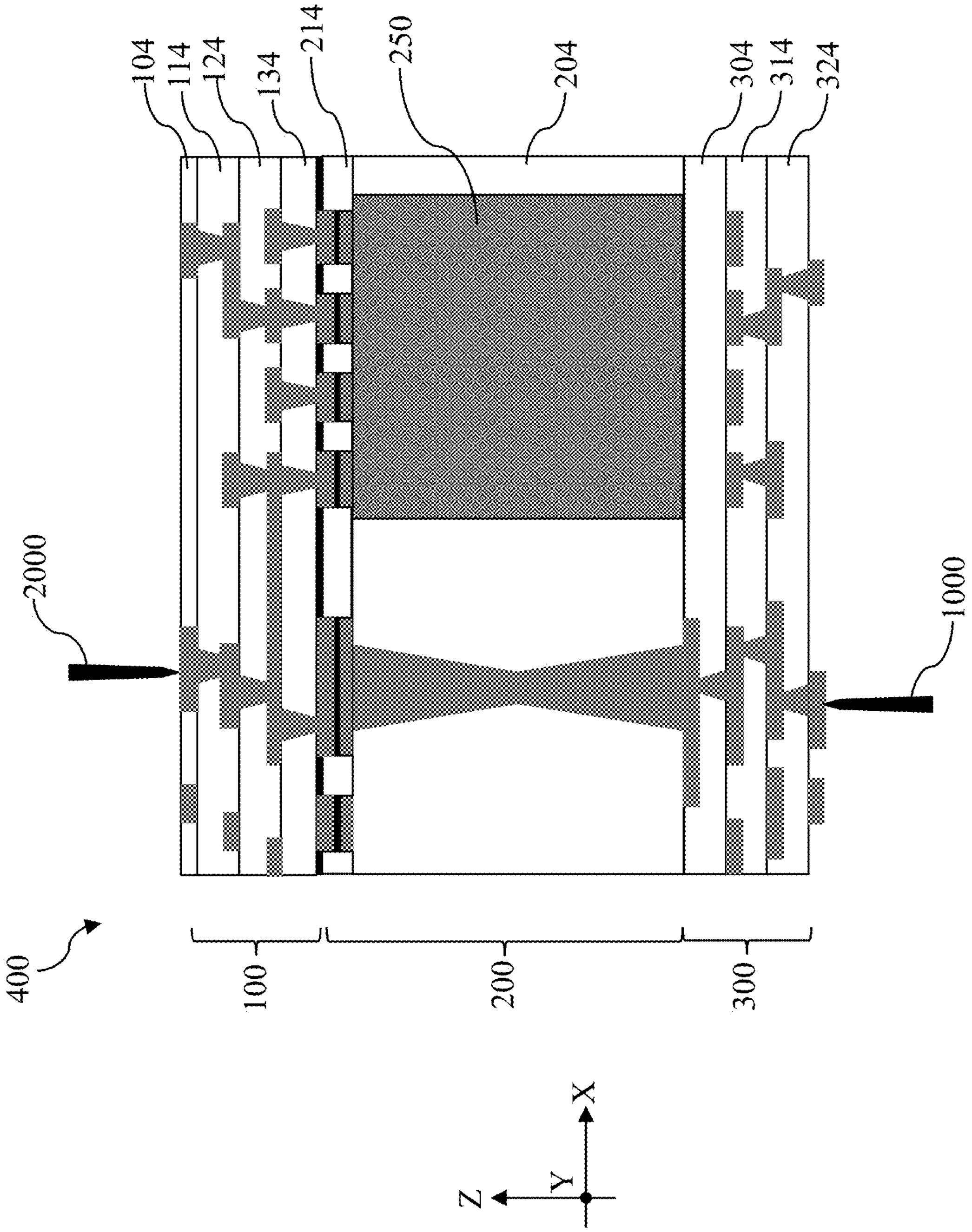

Referring to FIGS. 1 and 13, method 10 includes a block 28 where a third electrical test is performed on the device package 400. Unlike the first electrical test at block 16 or the second electrical test at block 20, the third electrical test is neither a biased highly accelerated stress test (b-HAST) nor a high-voltage temperature humidity bias test (HV-THB). While the third electrical test may be performed by using the at least one first probe 1000 and the at least one second probe 2000, the testing voltage may be between 1 and 2 times of the operating voltage of the embedded passive device 250. In some embodiments, the embedded passive device 250 has an operating voltage smaller than 10V, such as between about 1.5V and about 10V. In these embodiments, the testing voltage of the third electrical test may be between about 1.5V and about 20V. While the third electrical test may be carried out in a test chamber, the test chamber does not provide a high relative humidity and high temperature environment as in the first electrical test or the second electrical test. The testing signal of the third electrical test may be applied to or across the embedded passive device 250 because the embedded passive device 250 is designed to withstand up to two times of the operating voltage without failure.

The method described in the present disclosure may be applied to other package structures and arrangements, such as multi-chip module (MCM), flip chip chip scale package (FCCSP), or flip chip ball grid array (FCBGA) as long as the package structure including multiple parts and one of the multiple parts includes an embedded passive device.

One aspect of the present disclosure involves a method. The method includes forming a build-up structure that includes a plurality of metal layers embedded a plurality of dielectric layers, forming a core structure that embeds a passive device, performing a first electrical test on the build-up structure, performing a second electrical test on the core structure, and after performing the first electrical test and the second electrical test, bonding the build-up structure to the core structure.

In some embodiments, the forming of the build-up structure includes receiving a carrier substrate, coating a release film over the carrier substrate, depositing a plurality of build-up films and a plurality of metal layers over the release film to form the build-up structure, and releasing the build-up structure from the carrier substrate. In some implementations, each of the plurality of build-up films includes an Ajinomoto build-up film. In some instances, the plurality of metal layers include copper and titanium. In some embodiments, the core structure includes epoxy, resin, silica filler, glass fiber, or polyimide. In some instances, the passive device includes a multilayer ceramic capacitor (MLCC), a deep trench capacitor (DTC), or a metal-insulator-metal (MIM) capacitor. In some embodiments, each of the first electrical test and the second electrical test includes use of a testing voltage between about 100 V and about 200 V. In some embodiments, the second electrical test is performed such that the testing voltage of the second electrical test is not applied to the passive device.

Another aspect of the present disclosure involves a method. The method includes forming a first build-up structure on a core structure that embeds a passive device, forming a second build-up structure on a carrier substrate, detaching the second build-up structure from the carrier substrate, performing a first electrical test on the first build-up structure and the core structure, after the detaching, performing a second electrical test on the second build-up structure, and after performing the first electrical test and the second electrical test, bonding the first build-up structure to the core structure.

In some embodiments, the bonding includes depositing a build-up film over first metal pads on a front surface of the core structure, patterning the build-up film to expose the first metal pads, depositing a solder paste over the exposed first metal pads, depositing a glue paste over the patterned build-up film, aligning second metal pads on the second build-up structure with the exposed first metal pads, and reflowing the solder paste. In some embodiments, the depositing of the solder paste includes use of stencil printing. In some instances, the depositing of the glue paste includes use of injection printing. In some embodiments, the solder paste includes tin (Sn). In some embodiments, the passive device includes a multilayer ceramic capacitor (MLCC), a deep trench capacitor (DTC), or a metal-insulator-metal (MIM) capacitor. In some implementations, each of the first electrical test and the second electrical test includes use of a testing voltage between about 100 V and about 200 V. In some instances, the first electrical test is performed such that the testing voltage of the first electrical test is not applied to the passive device.

Still another aspect of the present disclosure involves a semiconductor structure. The semiconductor structure includes a first build-up structure, a core structure attached to the first build-up structure by way of a first plurality metal-to-metal interfaces and a first plurality of dielectric-to-dielectric interfaces, and a second build-up structure bonded to the core structure by way of a second plurality of metal-to-metal interfaces and a second plurality of dielectric-to-dielectric interfaces. The second plurality of metal-to-metal interfaces include tin (Sn) while the first plurality of metal-to-metal interfaces are free of tin (Sn).

In some embodiments, the second plurality of dielectric-to-dielectric interfaces include a glue paste while the first plurality of dielectric-to-dielectric interfaces are free of the glue paste. In some embodiments, the core structure includes a passive device that is susceptible to damages at a voltage between about 100 V and about 200 V. In some implementations, the passive device includes a multilayer ceramic capacitor (MLCC), a deep trench capacitor (DTC), or a metal-insulator-metal (MIM) capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a build-up structure that includes a plurality of metal layers embedded a plurality of dielectric layers;

forming a core structure that embeds a passive device, the core structure comprising a front surface and a back surface opposing the front surface;

performing a first electrical test on the build-up structure;

performing a second electrical test on the core structure; and after performing the first electrical test and the second electrical test, bonding the build-up structure to the core structure, wherein the second electrical test comprising probing from the front surface and the back surface of the core structure.

2. The method of claim 1, wherein the forming of the build-up structure comprises:

receiving a carrier substrate;

coating a release film over the carrier substrate;

depositing a plurality of build-up films and a plurality of metal layers over the release film to form the build-up structure; and releasing the build-up structure from the carrier substrate.

3. The method of claim 2, wherein each of the plurality of build-up films comprises an Ajinomoto build-up film.

4. The method of claim 2, wherein the plurality of metal layers comprise copper and titanium.

5. The method of claim 1, wherein the core structure comprises epoxy, resin, silica filler, glass fiber, or polyimide.

6. The method of claim 1, wherein the passive device comprises a multilayer ceramic capacitor (MLCC), a deep trench capacitor (DTC), or a metal-insulator-metal (MIM) capacitor.

7. The method of claim 1, wherein each of the first electrical test and the second electrical test comprises use of a testing voltage between about 100 V and about 200 V.

8. The method of claim 7, wherein the second electrical test is performed such that the testing voltage of the second electrical test is not applied to the passive device.

9. A method, comprising:

forming a first build-up structure on a core structure that embeds a passive device;

forming a second build-up structure on a carrier substrate;

detaching the second build-up structure from the carrier substrate;

performing a first electrical test on the first build-up structure and the core structure;

after the detaching, performing a second electrical test on the second build-up structure; and after performing the first electrical test and the second electrical test, bonding the first build-up structure to the core structure.

10. The method of claim 9, wherein the bonding comprises:

depositing a build-up film over first metal pads on a front surface of the core structure;

patterning the build-up film to expose the first metal pads;

depositing a solder paste over the exposed first metal pads;

depositing a glue paste over the patterned build-up film;

aligning second metal pads on the second build-up structure with the exposed first metal pads; and reflowing the solder paste.

11. The method of claim 10, wherein the depositing of the solder paste comprises use of stencil printing.

12. The method of claim 10, wherein the depositing of the glue paste comprises use of injection printing.

13. The method of claim 10, wherein the solder paste comprises tin (Sn).

14. The method of claim 9, wherein the passive device comprises a multilayer ceramic capacitor (MLCC), a deep trench capacitor (DTC), or a metal-insulator-metal (MIM) capacitor.

15. The method of claim 9, wherein each of the first electrical test and the second electrical test comprises use of a testing voltage between about 100 V and about 200 V.

16. The method of claim 15, wherein the first electrical test is performed such that the testing voltage of the first electrical test is not applied to the passive device.

17. A method, comprising:

forming a first build-up structure on a carrier substrate, the first build-up structure comprising metal features;

detaching the first build-up structure from the carrier substrate;

performing a first electrical test on the first build-up structure;

constructing a core structure including a plurality of contact pads;

performing a second electrical test on the core structure;

depositing a build-up film over the plurality of contact pads;

patterning the build-up film to expose the plurality of contact pads;

attaching the first build-up structure to the core structure such that the metal features interface the plurality of contact pads; and after the attaching, performing a third electrical test to the first build-up structure and the core structure.

18. The method of claim 17, wherein the patterning of the build-up film comprises use of laser drilling.

19. The method of claim 17, wherein the attaching comprises:

depositing a metal paste on the plurality of contact pads;

depositing a glue paste on the patterned build-up film;

aligning the first build-up structure and the core structure; and performing a reflow process to melt the metal paste and activate the glue paste.

20. The method of claim 19, wherein the depositing of the metal paste comprises use of a stencil printing process, wherein the depositing of the glue paste comprises use of an injection printing process.

* * * * *